United States Patent [19]

Griffin, Jr.

[11] 4,014,597

[45] Mar. 29, 1977

[54] SPEAKER ENCLOSURES

[75] Inventor: Timothy L. Griffin, Jr., Shutesbury, Mass.

[73] Assignee: Amanita Sound, Incorporated, Easthampton, Mass.

[22] Filed: Aug. 27, 1975

[21] Appl. No.: 608,234

[52] U.S. Cl. .............................. 312/7 R; 312/258; 179/1 GA; 179/1 E

[51] Int. Cl.² .................. A47B 81/06; A47B 43/00; H05K 5/00

[58] Field of Search ................ 312/7 R, 7 TV, 198, 312/199, 201, 258; 179/1 AT, 1 E, 1 GA; 181/198, 199

[56] References Cited

UNITED STATES PATENTS

| | | | |
|---|---|---|---|
| 1,652,219 | 12/1927 | Thomas | 312/7 R |
| 2,872,516 | 2/1959 | Hoffman | 179/1 E |
| 2,955,669 | 10/1960 | Rice | 181/199 |
| 3,032,137 | 5/1962 | Rice | 181/199 |
| 3,115,548 | 12/1963 | Stowell | 179/1 AT |
| 3,310,905 | 3/1967 | Davis et al. | 312/199 |
| 3,512,857 | 5/1970 | Butera | 312/258 |
| 3,637,938 | 1/1972 | Kuhlow et al. | 179/1 E |
| 3,892,917 | 7/1975 | Sotome | 179/1 GA |
| 3,912,866 | 10/1975 | Fox | 179/1 E |

FOREIGN PATENTS OR APPLICATIONS

| | | | |
|---|---|---|---|
| 581,435 | 8/1959 | Canada | 312/7 R |

*Primary Examiner*—Paul R. Gilliam
*Assistant Examiner*—Victor N. Sakran
*Attorney, Agent, or Firm*—Chapin, Neal and Dempsey

[57] ABSTRACT

Two main speaker enclosures when latched to each other at their open faces for transport purposes, enclose chambers that are of an internal configuration and dimension to respectively receive and hold two abutting auxiliary speakers in assembled relationship provided the two auxiliary speakers are inserted in a predetermined orientation. The chambers are formed by forwardly diverging walls of the speaker enclosures.

19 Claims, 7 Drawing Figures

FIG. 1
FIG. 2
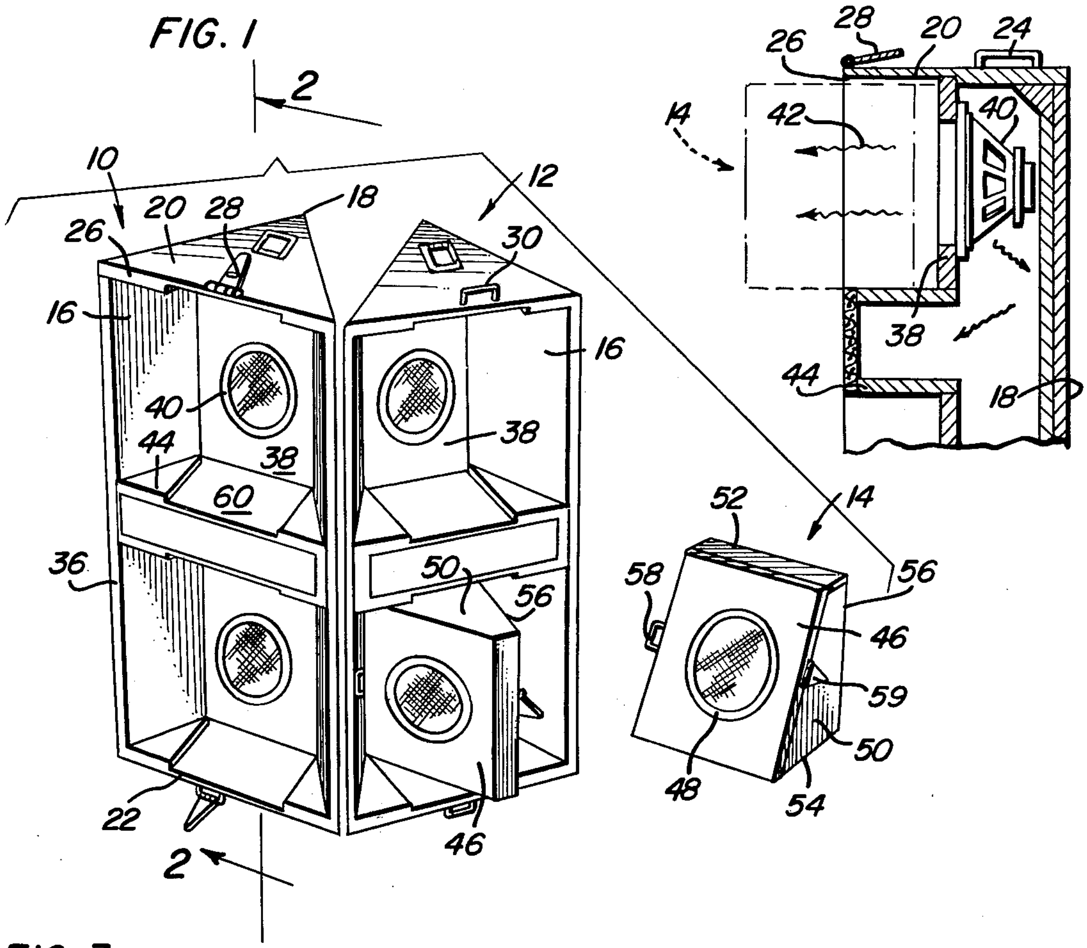
FIG. 3
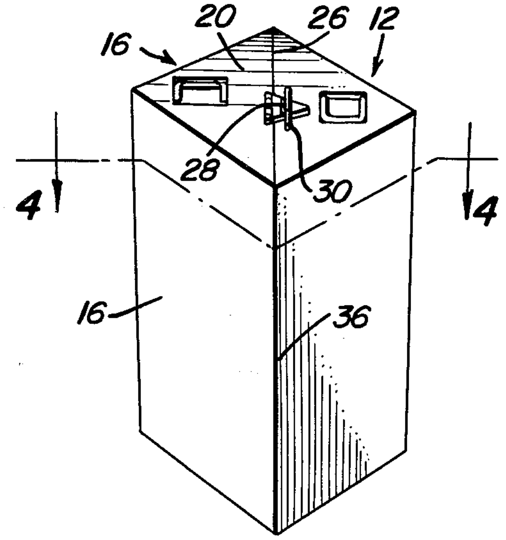
FIG. 4
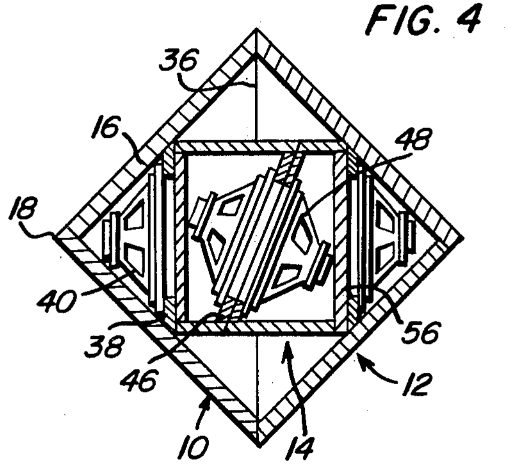

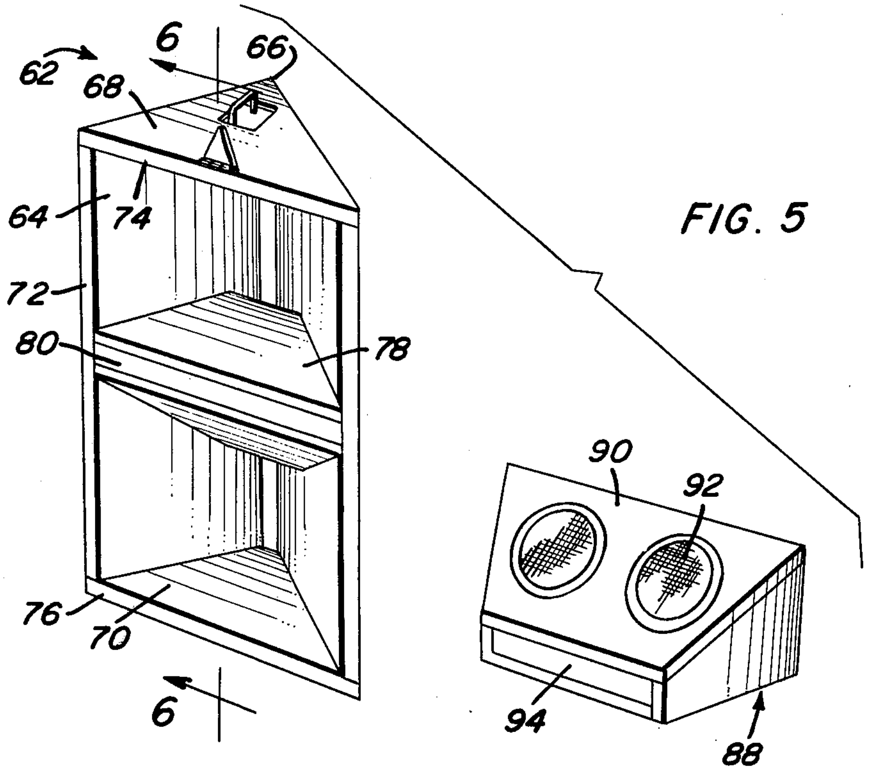
FIG. 5
FIG. 6
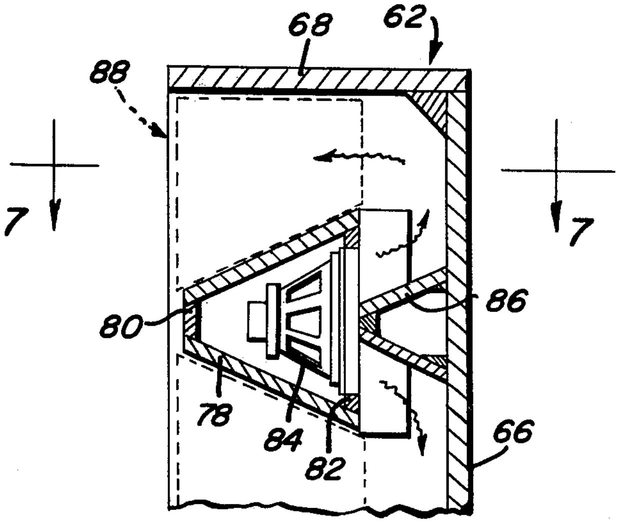
FIG. 7
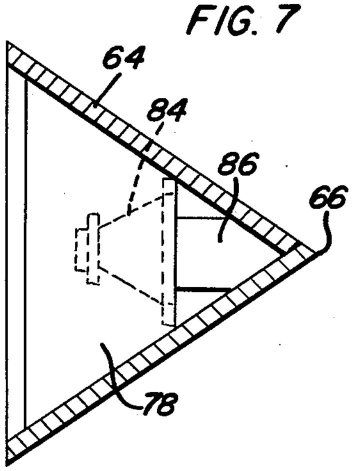

SPEAKER ENCLOSURES

This invention relates to the construction of speaker enclosures and their relationship to associated auxiliary speaker devices for transport purposes.

One of the major problems associated with musical organizations, resides in the constant transport of equipment to different entertainment locations. In regard to the transport of sound reproducing components, there is a particular problem because of the size and bulkiness of such components and the number of such components involved. Often, in addition to at least two relatively large speaker enclosures, such sound reproducing components include several smaller auxiliary or monitor speakers. Aside from the difficulty in transporting many separate components from one location to another, the likelihood of damage to the components results in expensive repairs and costly replacements. It is therefore an important object of the present invention to provide an arrangement and construction for speaker components so as to facilitate transport thereof and reduce the likelihood of damage during transport.

In accordance with the present invention, two main speaker enclosures of generally triangular cross section relative to the vertical axis thereof, are adapted to be latched or clipped together at their open faces in order to form a compact assembly or case for transport purposes. When so assembled, the speaker enclosures form completely closed internal chambers. Each of such internal chambers has such a configuration and is so dimensioned as to receive and hold therewithin two auxiliary or monitor speaker components. The auxiliary speaker components are held in a predetermined assembled relationship to each other within each of the closed chambers so that there will be no displacement between the speaker components relative to the enclosures during transport.

These together with other objects and advantages which will become subsequently apparent reside in the details of construction and operation as more fully hereinafter described and claimed, reference being had to the accompanying drawings forming a part hereof, wherein like numerals refer to like parts throughout.

FIG. 1 is a perspective view showing a pair of speaker enclosures and some associated auxiliary speaker components constructed in accordance with the present invention.

FIG. 2 is a partial section view taken substantially through a plane indicated by section line 2—2 in FIG. 1.

FIG. 3 is a perspective view showing an assembly of speaker enclosures and auxiliary speaker components arranged for transport purposes.

FIG. 4 is a top section view taken substantially through a plane indicated by section line 4—4 in FIG. 3.

FIG. 5 is a perspective view showing another form of speaker enclosure and associated auxiliary speaker component constructed in accordance with the present invention.

FIG. 6 is a partial sectional view taken substantially through a plane indicated by section line 6—6 in FIG. 5.

FIG. 7 is a top sectional view taken substantially through a plane indicated by section line 7—7 in FIG. 6.

Referring now to the drawings in detail, FIG. 1 illustrates a pair of speaker enclosures 10 and 12 of substantially the same construction which are adapted to be clipped or latched to each other in a carrying case assembly as illustrated in FIG. 3, for transport purposes. Also associated with the two speaker enclosures 10 and 12, are four monitor speaker components 14, two of which are shown in FIG. 1. The four monitor speaker components 14 are adapted to be stored within the speaker enclosures 10 and 12 when latched in assembled relationship to each other as shown in FIG. 3, as will be explained in detail hereafter.

Each of the speaker enclosures 10 and 12 includes vertically elongated side walls 16 which converge rearwardly from front edges 36 to a vertex 18 and are interconnected at the upper and lower longitudinal ends thereof by a triangular top wall 20 and a triangular bottom wall 22. The top, side and bottom walls are thus secured to each other in a manner well known to those skilled in the art in order to form the imperforate exterior of the speaker enclosure as shown. The top wall 20 may be provided on the exterior surface with a carrying handle 24. Also, each of the top and bottom walls of the speaker enclosures are provided adjacent the front edges 26 with any suitable cooperating latch elements 28 and 30. It will therefore be apparent that the cooperating latch elements will hold the speaker enclosures assembled with the front ends in abutment with each other at the top and bottom edges 26 as shown in FIG. 3. When separated as shown in FIGS. 1 and 2, each enclosure has a front opening defined by a continuous border formed by edges 26 and 36.

In the embodiment illustrated in FIG. 1, upper and lower forwardly radiating sound chambers or horns are formed between the forwardly diverging side walls 16, each chamber being recessed into the speaker enclosure and terminated by a speaker mounting panel 38 disposed in parallel spaced relation to the vertex 18 as more clearly seen in FIG. 2. A forwardly radiating speaker device 40 is mounted on each panel 38 for radiating reproduced sound through the front opening of the speaker enclosure as indicated by the arrows 42 in FIG. 2. Rearwardly radiated sound energy on the other hand may be reflected for forward radiation between the upper and lower chambers that are separated from each other by vertically spaced intermediate walls 44 interconnected with the speaker panels 38 in parallel spaced relationship to the top and bottom walls 20 and 22. Although a single speaker 40 is shown mounted on each panel 38, it will be appreciated that two or more speakers could be mounted on the panel in which case the speaker enclosure will be dimensioned accordingly.

Each of the monitor speaker components 14 as shown in FIGS. 1 and 4, has an external configuration arranged to present an upwardly inclined external speaker panel 46 mounting a forwardly radiating auxiliary speaker 48. The speaker panel 46 is interconnected with trapezoidal side walls 50 and rectangular top and bottom walls 52 and 54. Thus, when two auxiliary speaker components 14 are assembled with their front inclined panels 46 abutting each other as shown in FIG. 4, they will form a cubic or rectangular external configuration dimensioned to be received within a closed upper or lower chamber formed between assembled speaker enclosures with the rectangular back walls 56 of assembled auxiliary speaker components abutting the speaker mounting panels 38 associated with the speaker enclosures 10 and 12. It will therefore be apparent that a total of four auxiliary speaker components may be held within the two closed chambers formed between the assembled speaker enclosures 10 and 12.

When two auxiliary speaker components 14 are properly assembled in abutting relationship to each other they may be held in such assembled relationship by clips 58 and 59 and may be fitted into an open end of one of the speaker enclosure chambers in proper oriented relationship to the speaker enclosure as dictated by guide grooves or recesses 60 formed in the top, intermediate and bottom walls. Thus, an assembly of two speaker enclosures and four auxiliary speaker components may be transported as a single unit without any relative displacement between the auxiliary speaker components and the speaker enclosures.

In FIG. 5, another type of speaker enclosure 62 is illustrated which is externally similar to the speaker enclosures 10 and 12 previously described in that it is formed by a pair of vertical side walls 64 converging 40 to a vertex 66 and interconnected with triangular top and bottom walls 68 and 70. The front edges 72 of the side walls and the front edges 74 and 76 of location top and bottom walls thus form an open face of the enclosure 62 which is adapted to abut a similar enclosure and held in assembled relation therewith for transport purposes as hereinbefore described with respect to enclosures 10 and 12. However, the speaker enclosure 62 as more clearly seen in FIGS. 6 and 7, is internally formed as a folded horn. Toward that end, vertically spaced intermediate walls 78 extend horizontally between and are interconnected with the side walls 64. The intermediate walls 78 are interconnected adjacent the open end by a spacer 80 and diverge rearwardly to a location9c spaced from the rear vertex 66 at which the rear edges of the intermediate walls 78 are interconnected with a speaker mounting panel 82 to form forwardly diverging passages. A speaker device 84 is mounted on the panel 82 between the intermediate walls 78, and radiates rearwardly into upper and lower internal chambers of the speaker enclosure separated by forwardly converging dividers 86. The rearwardly radiated sound energy from the speaker device 84 is therefore reflected at the vertex 66 and is emitted forwardly from the front opening of the speaker enclosure through forwardly diverging passages formed by the side walls 64, an intermediate wall 78 and a top or bottom wall 68 or 70.

Each of the upper and lower passages of the speaker enclosure 62 is adapted to completely receive a single auxiliary speaker component 88 as more clearly seen in FIG. 1. The speaker component 88 is externally configured and dimensioned so as to be wedged into or snugly fit within an upper or lower passage of the speaker enclosure 62 as shown by dotted line in FIG. 6. Thus, the auxiliary speaker component 88 includes an external speaker mounting panel 90 from which sound is radiated forwardly by a pair of speaker devices 92. The speaker panel 90 constitutes the largest external face area of the component 88 and is interconnected with trapezoidal side walls 92 that diverge rearwardly from a rectangular front wall 94. Rectangular back and bottom walls interconnect the side walls 92, front wall 94 and speaker panel 90. Unlike the rectangular speaker panel 46 associated with the auxiliary speaker component 14 hereinbefore described, the speaker panel 90 of component 88 is trapezoidal in shape and is adapted to abut an intermediate wall 78 within the speaker enclosure 62 when the component 88 is properly orientated prior to being fully inserted into an upper or lower chamber of the speaker enclosure 62. It will be apparent in connection with the speaker enclosure and auxiliary components 88, that no guide formation is required such as the guide recess 60 associated with the speaker enclosures 10 and 12. Instead, the inclined walls 78 function as the guide means. Thus, four auxiliary speaker components 88 may be retained within two speaker enclosures 62 that are latched to each other in assembled relationship.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. In combination with at least two speaker enclosures having acoustical properties and a plurality of auxiliary speaker components, means for holding said speaker enclosure assembled to form a carrying case and to internally define at least one closed chamber extending therebetween, two of said auxiliary speaker components when abutting in predetermined relation to each other forming an external configuration dimensioned to fit within said closed chamber, and means mounted within said enclosures for preventing the auxiliary speaker components stored in said predetermined abutting relationship within the closed chamber from being displaced relative to each other.

2. The combination of claim 1 wherein each of said speaker enclosures is formed from walls that define one-half of said closed chamber, said walls diverging forwardly toward an open end to form a forwardly radiating section of a horn.

3. The combination of claim 2 wherein said means for holding the enclosures assembled includes releasable latch devices located adjacent the open ends at which the enclosures are held in abutting relation to each other.

4. The combination of claim 3 including a speaker mounting panel fixed internally within each of the enclosures at one end of said horn.

5. The combination of claim 4 including a direct radiating speaker mounted on said panel.

6. The combination of claim 5 wherein said closed chamber is defined by said diverging walls and the speaker mounting panel in each of the enclosures.

7. The combination of claim 6 wherein each of the auxiliary speaker components includes an external speaker mounting panel, said external speaker mounting panels of the two auxiliary speaker components being held in abutment with each other to form said external configuration.

8. The combination of claim 7 wherein said holding means includes guide means mounted within each enclosure for partially receiving said two auxiliary speaker components only when held in abutment with each other to form said external configuration.

9. The combination of claim 4 including a rearwardly radiating speaker mounted on said panel.

10. The combination of claim 9 wherein at least one of said diverging walls terminates at the speaker mounting panel to form a folded type of horn within the enclosure.

11. The combination of claim 10 wherein said one half of the closed chamber completely receives therein one of the two auxiliary speaker components.

12. The combination of claim 1 wherein each of the auxiliary speaker components includes an external speaker mounting panel, said external speaker mounting panels of the two auxiliary speaker components being held in abutment with each other to form said external configuration.

13. The combination of claim 1 wherein said holding means includes guide means mounted within each enclosure for partially receiving said two auxiliary speaker components only when held in abutment with each other to form said external configuration.

14. The combination of claim 2 wherein said one half of the closed chamber completely receives therein one of the two auxiliary speaker components.

15. The combination of a speaker enclosure having acoustical properties and at least two speaker components, said enclosure including forwardly diverging walls forming a sound radiating chamber, an internal speaker mounting panel to which one of the speaker components is fixed, said other of the speaker components having a separate housing completely received within said chamber only when inserted in a predetermined orientation relative to the enclosure and having an external configuration dimensioned to substantially abut each of the diverging walls of the chamber when fully inserted for storage purposes.

16. In combination with a plurality of speaker components, a portable assembly comprising a pair of acoustical enclosures, means fixedly mounting one of said speaker components in each of the enclosures, each of the enclosures having imperforate walls terminating at a continuous edge defining an opening through which sound waves generated by said one of the speaker components are adapted to be radiated, latch means for holding the enclosures in abutment with each other along the edges to enclose a storage chamber extending between and into both of the enclosures, and means mounted by at least one of the enclosures for releasably holding the other of the speaker components stored within the storage chamber only in predetermined orientation.

17. The combination of claim 16, including handle means connected to at least one of the enclosures for transport of the assembly.

18. The combination of claim 16, wherein said releasable holding means includes a guide formation in the walls of the enclosures locking the stored speaker components against displacement relative to each other and the enclosures.

19. The combination of claim 16, wherein said releasable holding means includes partition walls internally fixed within the enclosures to form forwardly radiating passage portions into which the other of the speaker components are wedged for storage purposes.

* * * * *